US010136546B2

(12) United States Patent
Skidmore

(10) Patent No.: US 10,136,546 B2
(45) Date of Patent: Nov. 20, 2018

(54) PORTABLE TOOL AND METHOD FOR TEMPORARILY SUPPORTING ELECTRONIC EQUIPMENT ON A RACK

(71) Applicant: Stephen Skidmore, Harleysville, PA (US)

(72) Inventor: Stephen Skidmore, Harleysville, PA (US)

(*) Notice: Subject to any disclaimer, the term of this patent is extended or adjusted under 35 U.S.C. 154(b) by 327 days.

(21) Appl. No.: 14/984,307

(22) Filed: Dec. 30, 2015

(65) Prior Publication Data
US 2017/0196115 A1  Jul. 6, 2017

(51) Int. Cl.
*H05K 7/14* (2006.01)
*B25B 7/02* (2006.01)

(52) U.S. Cl.
CPC ......... *H05K 7/1489* (2013.01); *H05K 7/1491* (2013.01); *B25B 7/02* (2013.01)

(58) Field of Classification Search
CPC ...... H05K 7/1489; H05K 7/1491; B25B 7/02; B25B 7/123; B25B 7/22; B25B 7/00; B25B 7/04
See application file for complete search history.

(56) References Cited

U.S. PATENT DOCUMENTS

| 5,899,035 | A | * | 5/1999 | Waalkes | E04B 2/7433 |
| | | | | | 211/192 |
| 6,021,909 | A | * | 2/2000 | Tang | H02B 1/36 |
| | | | | | 211/183 |
| 6,202,965 | B1 | * | 3/2001 | Chong | A47B 47/05 |
| | | | | | 248/220.43 |
| 6,220,456 | B1 | | 4/2001 | Jensen et al. | |
| 6,230,903 | B1 | * | 5/2001 | Abbott | H05K 7/1421 |
| | | | | | 211/190 |
| 6,301,846 | B1 | * | 10/2001 | Waalkes | A47B 21/06 |
| | | | | | 52/220.7 |
| 6,422,399 | B1 | * | 7/2002 | Castillo | A47B 57/40 |
| | | | | | 211/175 |
| 6,546,684 | B2 | * | 4/2003 | Waalkes | E04B 2/7433 |
| | | | | | 52/239 |
| 6,622,873 | B2 | * | 9/2003 | Hegrenes | H05K 7/183 |
| | | | | | 211/187 |
| 6,655,534 | B2 | | 12/2003 | Williams et al. | |
| 6,840,388 | B2 | * | 1/2005 | Mayer | A47B 57/485 |
| | | | | | 211/26 |

(Continued)

*Primary Examiner* — Monica Carter
*Assistant Examiner* — Danny Hong
(74) *Attorney, Agent, or Firm* — Howson & Howson LLP

(57) ABSTRACT

A tool for temporarily supporting electronic equipment or panel on an equipment rack is provided. The tool includes an engagement block having a pin for insertion through a mounting aperture of a post of the rack and an upper support surface for supporting or positioning a mounting flange of a faceplate of electronic equipment or panel rested freely thereon. The support surface is spaced from the pin such that, when the pin is inserted into a mounting aperture of the post and the mounting flange of the faceplate is freely rested on the support surface, a mounting aperture extending through the mounting flange is caused to be aligned with a mounting aperture extending through the post of the equipment rack to enable ready permanent connection of the mounting flange to the post with fastening hardware. A method of mounting electronic equipment or panel on an equipment rack is also provided.

13 Claims, 5 Drawing Sheets

(56) References Cited

U.S. PATENT DOCUMENTS

| | | | |
|---|---|---|---|
| 7,134,558 B1 | 11/2006 | Mimlitch, III et al. | |
| 7,357,362 B2 * | 4/2008 | Yang | H05K 7/1489 248/220.22 |
| 7,762,411 B2 * | 7/2010 | Hilburn | H05K 7/1489 211/192 |
| 7,857,145 B2 * | 12/2010 | Mushan | H05K 7/1489 211/26 |
| 8,025,166 B2 | 9/2011 | Hilburn et al. | |
| 8,376,293 B2 * | 2/2013 | Grady, IV | H05K 7/1489 248/201 |
| 2002/0043508 A1 | 4/2002 | Lewis | |
| 2002/0100847 A1 | 8/2002 | Lopez | |
| 2008/0217274 A1 | 9/2008 | Curnalia et al. | |
| 2013/0075350 A1 | 3/2013 | Raney | |
| 2015/0014912 A1 | 1/2015 | Ivey et al. | |

* cited by examiner

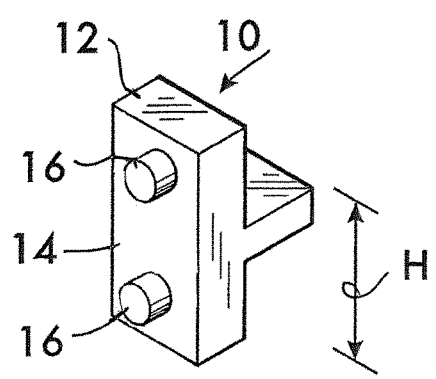
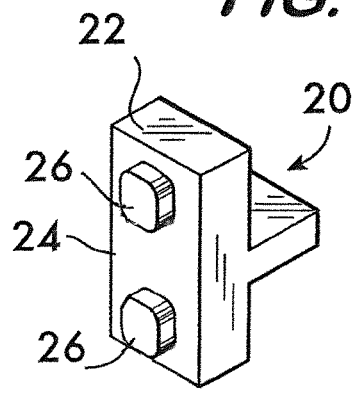
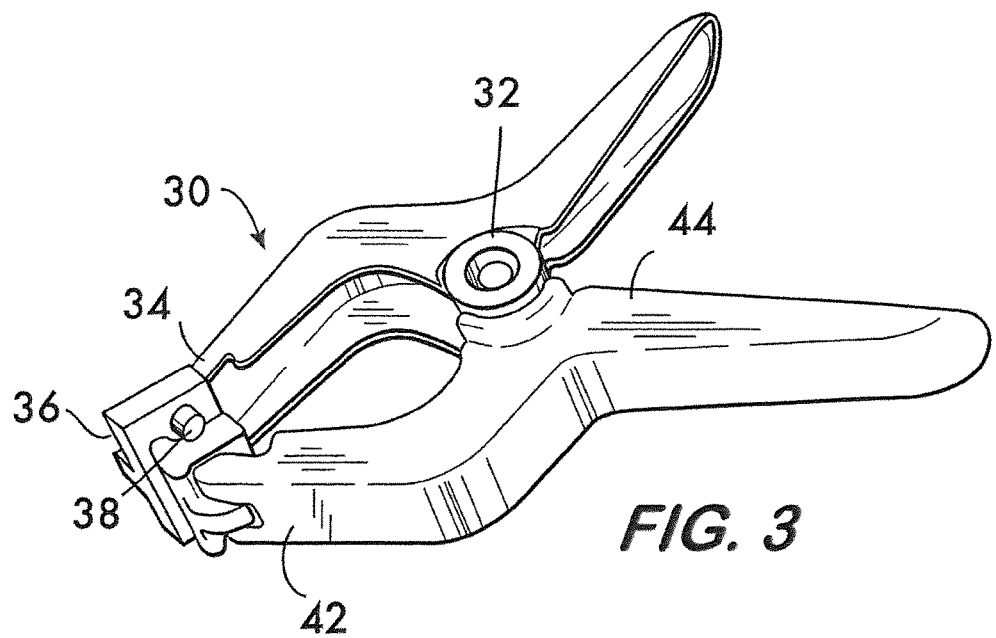

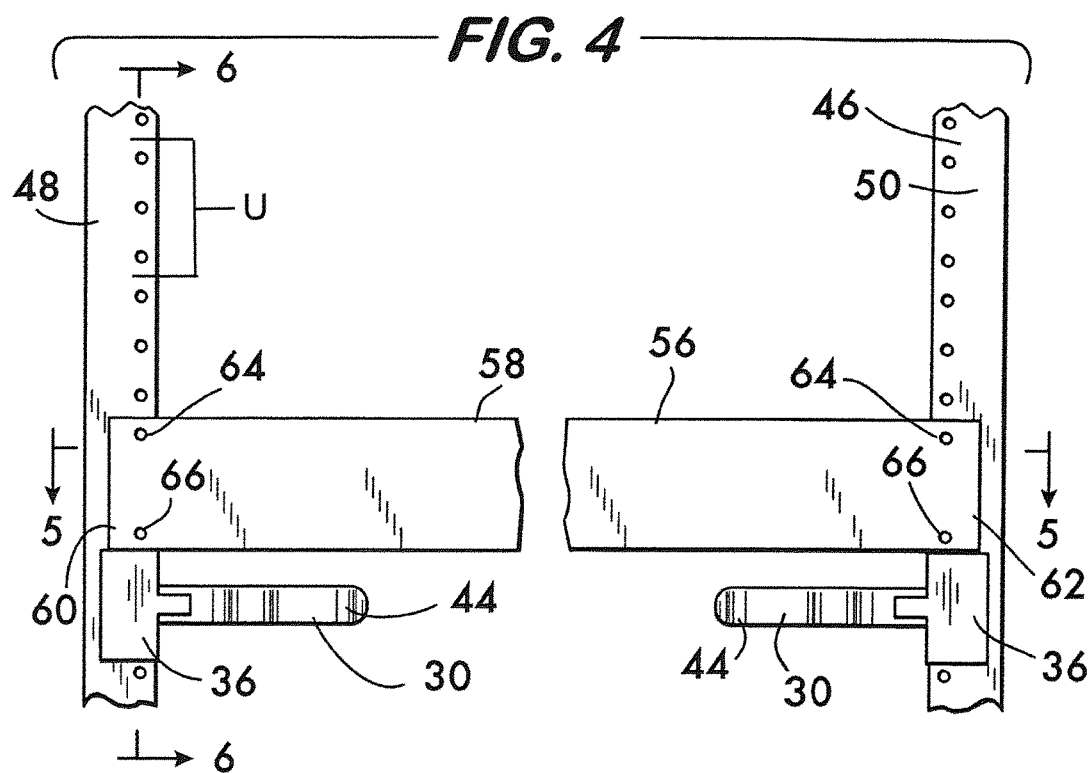
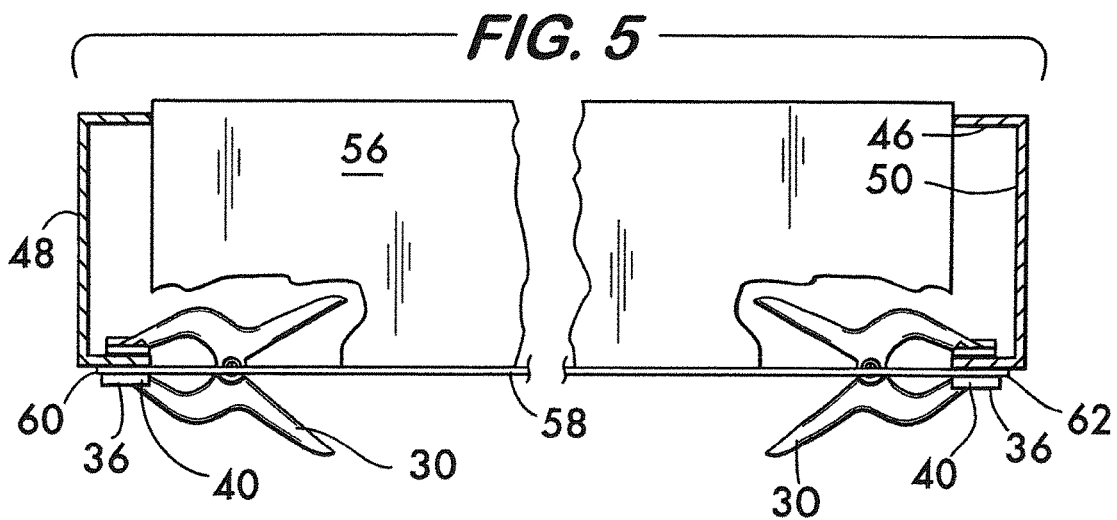

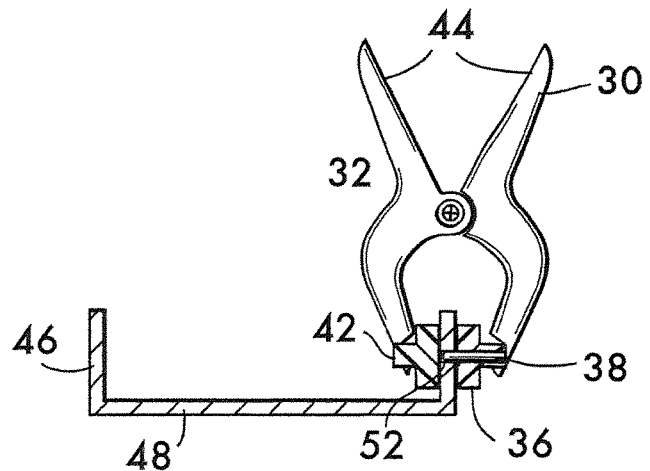
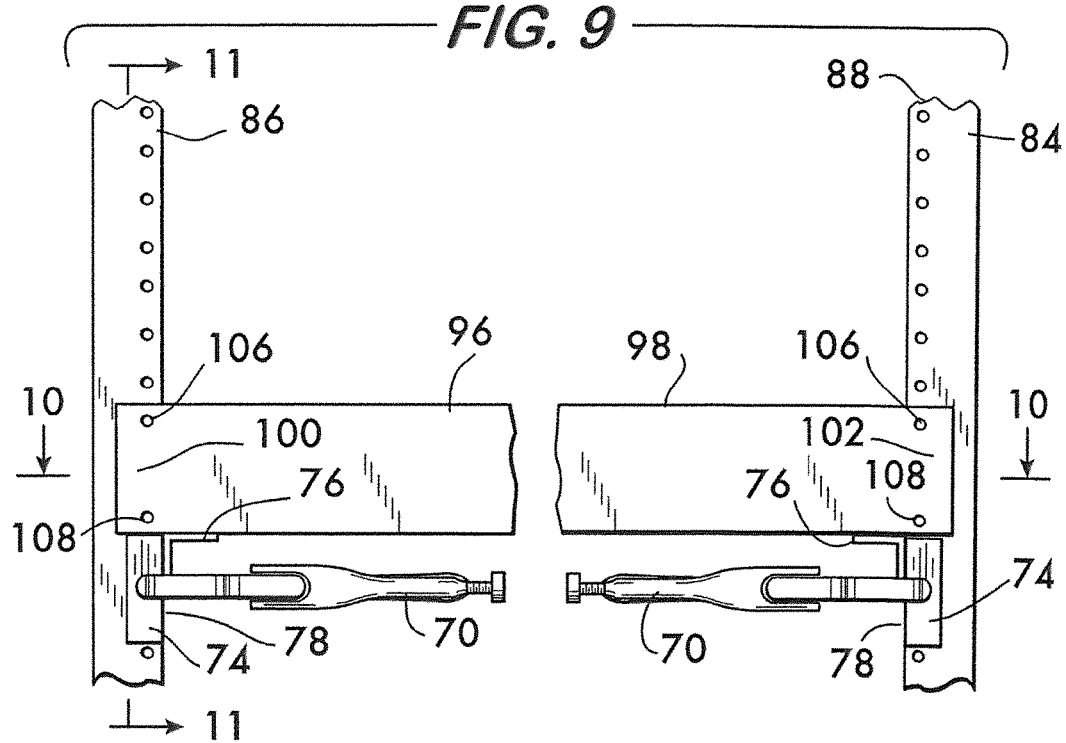

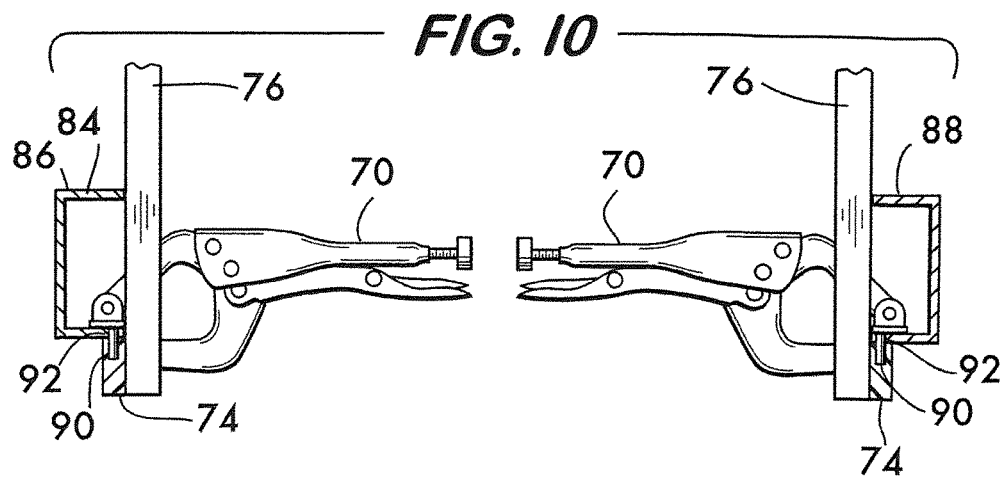
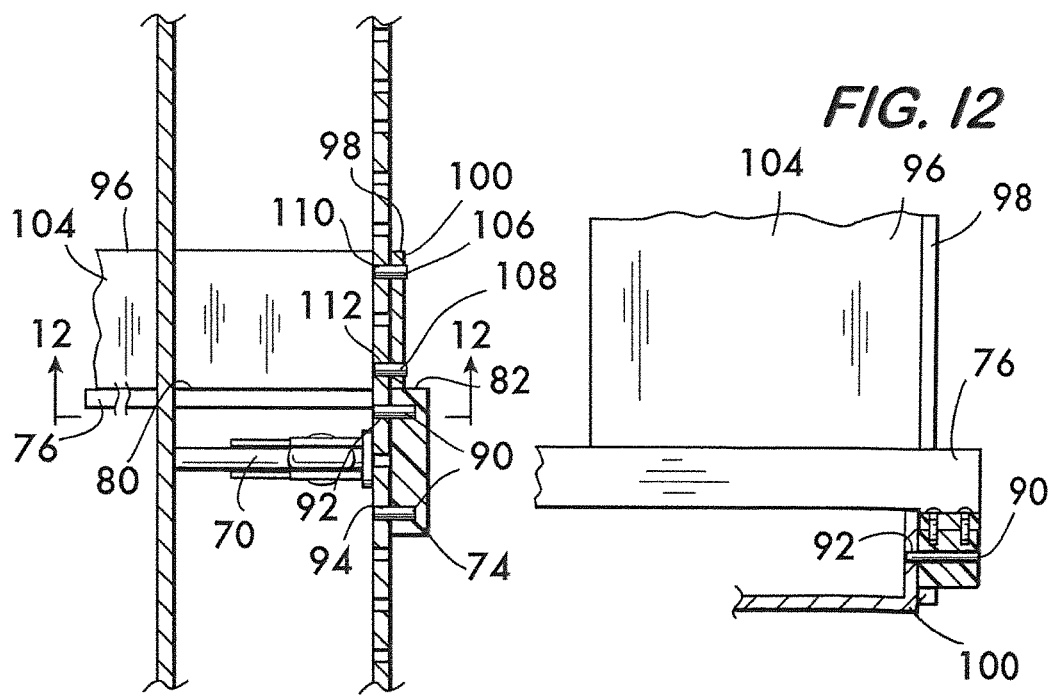

PORTABLE TOOL AND METHOD FOR TEMPORARILY SUPPORTING ELECTRONIC EQUIPMENT ON A RACK

BACKGROUND

This disclosure relates to a device and a method for supporting electronic equipment in an equipment rack, and more particular, to a portable tool and method for temporary supporting and aligning electronic equipment during installation of the electronic equipment on the equipment rack.

Electronic components or equipment, such as computer equipment, servers, communication equipment, electronic connector strips, patch panels, control panels and the like are typically in the form of black-box or panel type units mounted on an equipment or server rack within a server room or like facility. An equipment or server rack typically comprises a metal frame having vertical posts with a plurality of apertures formed in a front facing wall thereof. Each piece of electronic equipment or panel may include a faceplate having outwardly extending rack securement flanges that extend horizontally across the front facing walls of a pair of the posts, and fastening hardware may be utilized to secure the flanges directly to the posts. Typically, this is accomplished with threaded fasteners that extend through aligned apertures formed in the posts and the flanges.

The Electronic Industries Association (ETA) provides standardized specifications for equipment rack designs which are available in various sizes and designs (i.e., four posts, two posts, various widths, dimensions, etc.). By way of a specific example, the ETA-310-D specification provides standards for a conventional 19 inch equipment rack. For instance, this specification standardizes several important features of 19 inch racks, such as the so-called "Rack Unit" (RU or U), vertical hole spacing, horizontal hole spacing, rack opening and front panel width. The specification also sets tolerances on each of these dimensions.

Vertical hole spacing of the holes provided in a post are typically not entirely uniform and may provide an irregular series of mounting holes in repeating patterns. For instance, the EIA-310-D standards define a repeating pattern of apertures or holes provided on each post of the rack. One Rack Unit (RU or U) has a height of 1.75 inches and spans three vertically-spaced holes such that adjacent ones of the holes in the Rack Unit are spaced apart by ⅝ inch (0.625 inch). Adjacent holes of adjacent Rack Units are spaced apart by only ½ inch (0.5 inch). Thus, the repeating pattern of vertical hole spacing is ½ inch-⅝ inch-⅝ inch-½ inch-⅝ inch-⅝ inch and so on. Of course, this merely provides one example of a vertical hole spacing pattern that may be present on a post of a rack and these patterns may vary depending upon specifications.

Typically, when a technician is provided with the task of mounting electronic equipment or a panel on an equipment rack, it is a task performed by a single person. Thus, the technician is required to steadily support the piece of electronic equipment or panel in one hand in a manner maintaining precise alignment of mounting holes in the faceplate of the electronic equipment with the desired set of holes on the post. While the above referenced alignment is maintained, the technician must utilize his/her single free hand to place a fastener, such as a threaded fastener, on the tip of a screwdriver or like tool and extend the fastener through apertures formed in the mounting flange of the electronic equipment and the post and then secure the fastener to the post. Typically, three additional fasteners must also be applied before the electronic equipment or panel is firmly mounted to the rack with a set of four fasteners, two per post. Of course, more or less fasteners may be required.

Accordingly, the above referenced mounting procedure may require relatively awkward movements and manipulations by a technician to complete the mounting task. The possibility of delays and the potential dropping of equipment, panels, fasteners, tools, or the like are possible.

Thus, a device and method that could free the hand of the technician supporting the electronic equipment or panel in the above process so that both hands of an installer could be used to install fasteners through properly aligned mounting apertures of electronic equipment or panel and metal posts of an equipment rack would be desirable and should enable electronic equipment and panels to be more reliably secured to a post of an equipment rack in a reduced amount of time by a single technician.

BRIEF DESCRIPTION OF THE DRAWINGS

FIG. 1 is a perspective view of an engagement block in accordance with a first embodiment.

FIG. 2 is a perspective view of an engagement block in accordance with a second embodiment.

FIG. 3 is a perspective view of a tool having an engagement block in accordance with a third embodiment.

FIG. 4 is a front elevational view of an equipment rack during a mounting procedure using the tool of FIG. 3 in accordance to an embodiment.

FIG. 5 is a cross-sectional view taken along line 5-5 of FIG. 4 and with part of the electronic equipment shown broken away.

FIG. 8 is a cross-sectional view taken along line 8-8 of FIG. 6.

FIG. 9 is a front elevational view of an equipment rack during a mounting procedure using the tool of FIG. 7 in accordance with an embodiment.

FIG. 10 is a cross-sectional view taken along line 10-10 of FIG. 9.

FIG. 11 is a cross-sectional view taken along line 11-11 of FIG. 9.

FIG. 12 is a cross-sectional view taken along line 12-12 of FIG. 11.

DETAILED DESCRIPTION

Figure 6:
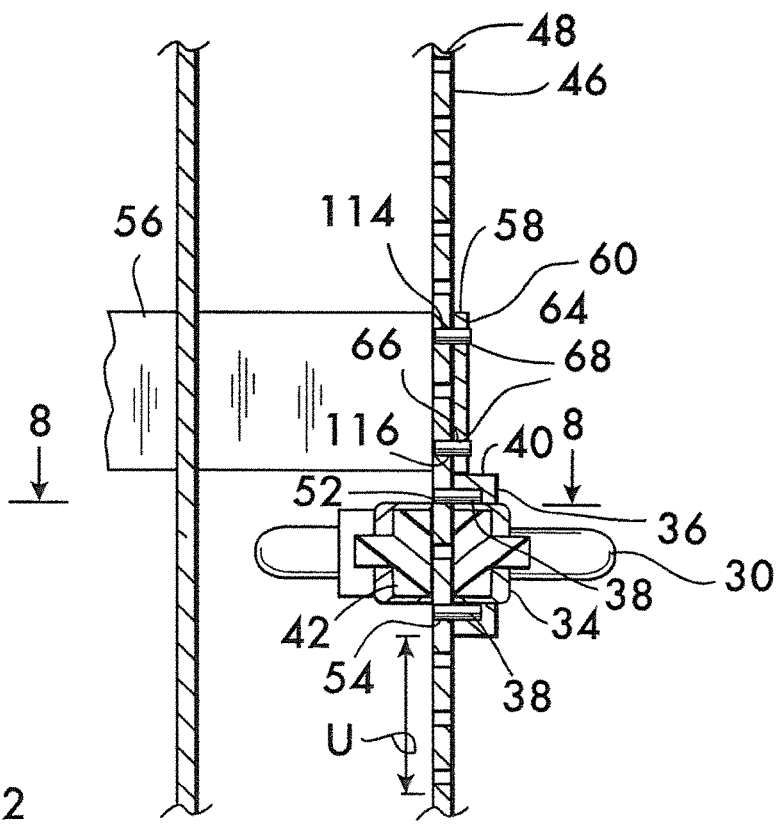
FIG. 6 is a cross-sectional view taken along line 6-6 of FIG. 4.

For simplicity and illustrative purposes, the principles of embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and devices have not been described in detail so as not to unnecessarily obscure the embodiments.

According to an embodiment, an engagement block 10, such as shown in FIG. 1, may be temporarily engaged with an upright post of an equipment or server rack for the purpose of temporarily supporting and/or aligning a piece of electronic equipment, such as a server or the like, or a panel, such as a patch panel, control panel or the like to be mounted on the rack by a technician. For this purpose, typically, a pair of engagement blocks 10 is used, one for each front post of the rack, with each being engaged at the same height or elevation on opposite posts (i.e., right and left front posts) of the rack. The pair of engagement blocks may be interconnected and provided as a single tool or may be provided as two separate tools. As another alternative, since some racks have four posts (i.e., two front posts and two rear posts), four engagement blocks 10 may be used (i.e., one per post).

When engaged to a post, the engagement block 10 has an upper support surface 12 (which may form an uppermost surface of the engagement block 10) that extends substantially horizontal at a precise elevation to provide a support surface for a mounting flange of a faceplate of electronic equipment or of a patch panel, control panel or the like to be mounted to the rack. The location of the support surface 12 relative to the post is such that mounting apertures in the mounting flange of the faceplate freely rested and/or supported on the support surface 12 will necessarily be precisely aligned with mounting apertures of the post of the rack. Thus, the engagement block 10 may be used to temporarily support and/or position a faceplate on a rack to properly align the mounting holes of the mounting flanges with corresponding mounting holes in the posts of the rack.

Thus, the opposite mounting flanges of the faceplate of the electronic equipment or panel may be rested or positioned on a pair of the engagement blocks 10 across a pair of posts of the rack by a technician. With respect to relatively lightweight items such as panels, the mass of the item is primarily provided by the faceplate itself. By resting such a panel or lightweight item on the engagement blocks 10, both hands of the technician are now free. Alternatively, for larger or heavier items, such as a server or the like, the center of mass of the equipment may be located well behind the faceplate. In this case, an elongate support may be used in connection with the engagement block to support the equipment. Here, the engagement block primarily serves the purpose of properly positioning the faceplate to align mounting holes. Accordingly, in either case, the technician is able to use both hands to apply fastening hardware, such as threaded fasteners, through the aligned mounting holes on the mounting flanges of the faceplate and into the corresponding aligned mounting holes of the posts of the rack. The fasteners secure the mounting flanges of the electronic equipment or panels directly to the posts.

After the faceplate of the electronic equipment or panel supported or positioned by the engagement blocks 10 is secured directly to the posts with fastening hardware, the engagement blocks 10 may be removed from the posts. This can be readily accomplished because the engagement blocks 10 only extend underneath the electronic equipment or panel and are not otherwise attached in any manner to the electronic equipment or panel or between the electronic equipment or panel and the posts. Thus, removal of the engagement blocks 10 is not prevented by the newly mounted electronic equipment or panel since there is no interference with its removal after installation of the electronic equipment or panel is complete.

In addition to including a support surface 12, each mounting block also includes a face 14 that confronts a post of the rack. One or more engagement pins 16 extend inward from the face 14 for being received in mounting apertures of the post of the rack. For example, in the embodiment shown in FIG. 1, a pair of spaced apart pins 16 is provided. In the embodiment shown in FIG. 1, each pin is circular in cross-section for use with a post having circular mounting apertures. In the alternate embodiment shown in FIG. 2, an engagement block 20 has a support surface 22, a face 24, and a pair of engagement pins 26 with each pin 26 being substantially square in cross-section for use with a post having square mounting apertures.

The pins, 16 and 26, provide a pair of functions. First, the pins, 16 and 26, support or transfer the weight of the engagement blocks, 10 and 20, and any equipment or panel positioned thereon to the rack. For instance, the pins, 16 and 26, fit into corresponding apertures in the post such that the engagement blocks, 10 and 20, can readily support the weight of the faceplate that may be temporarily positioned thereon during an installation process. Second, the location of the pins, 16 and 26, relative to the support surfaces, 12 and 22, is such that the support surfaces, 12 and 22, are always properly located on a post to ensure that the mounting apertures in the mounting flange of the electronic equipment freely resting on the support surfaces, 12 and 22, are precisely aligned directly in front of desired mounting apertures of the post.

As discussed above, most posts have standardized vertical hole spacing that are typically provided by an irregular series of mounting holes in repeating patterns. By way of example, the EIA-310-D standards for a 19 inch width rack define each Rack Unit (U) as having a height of 1.75 inches and spanning three vertically-spaced holes such that adjacent ones of the holes within the same Rack Unit (U) are spaced apart by ⅝ inch (0.625 inch). In contrast, adjacent holes of adjacent Rack Units (U) are spaced apart by only ½ inch (0.5 inch). Accordingly, a juncture between two adjacent Rack Units (U) would be located above ¼ inch (0.25 inch) between adjacent holes of adjacent Rack Units (U).

Accordingly, an engagement block 10 for use with such a rack may have a pair of pins 16 spaced apart by 1¼ inch (1.25 inch) which equals the spacing between the top and bottom holes of the above referenced single Rack Unit (U). In addition, the support surface 12 may be located relative to the pins 16 such that the support surface is located between a juncture of adjacent Rack Units (U) so that the support surface 12 is properly located to support a faceplate of electronic equipment or panel aligned with a Rack Unit directly above the juncture.

According to some embodiments, the height "H" of the engagement block 10 may equal one Rack Unit (U). Thus, when attached to a rack, the spacing of the pins 16 only enable the engagement block 10 to be attached to the post corresponding a Rack Unit (U) defined by the post. Thus, the support surface 12 of the engagement block 10 will automatically be located at the juncture between two adjacent Rack Units. Of course, the dimensions discussed above for engagement block may be altered, as desired, and based on the dimensions of the Rack Unit and vertical hole spacing of the rack on which it will be used.

The engagement block 10 may be removably secured to the post in any of various manners. For example, the engagement block 10 may be made of a magnetic material that magnetically attracts and secures to the metal post of the rack. Alternatively, a part of the engagement block 10 may be formed of a magnetic material, such as face 14, or a magnet may be embedded within the engagement block 10. As a further alternative, separate engagement clips (not shown) may be applied to the free ends of the pins 16 that extend through the mounting apertures on the post of the rack. Still further, the engagement block 10 may be utilized in connection with a clamp or like tool to enable the clamp to secure the engagement block 10 to a post (for instance, see FIGS. 3 and 7 discussed in greater detail below). Of course, other mechanical means for temporarily securing the engagement blocks, 10 and 20, to posts may be used provided the engagement blocks may be readily removed from the posts after installation of electronic equipment or panel to a rack is complete.

A hand-held portable tool 30 is shown in FIG. 3. The tool 30 may include a spring clamp 32. One of the jaws 34 of the spring clamp 32 may include an engagement block 36. Engagement block 36 may be identical to engagement block 10 discussed above in detail. The engagement block 36 include one or more pins 38 and a support surface 40 such as shown in FIG. 5, and the one or more pins 38 may extend in a direction toward the opposite jaw 42 of the spring clamp 32. The tool 30 may be adapted for use in installing relatively lightweight panels on a rack, such as patch panels, control panels, or other items in which the weight of the item is essentially provided by a faceplate thereof.

Accordingly, a technician may grasp the hand-engaging end 44 of the tool 30, manipulate the spring clamp 32 to an open position, locate the open jaws, 34 and 42, of the spring clamp 32 at a desired height on a post of a rack, and permit the jaws to return to the normally-closed position under the force of the spring or the like. In this manner, the pins 38 of the engagement block 36 can be aligned with and extend through corresponding mounting apertures in the post and the spring clamp 32 may maintain the engagement block 36 at the desired location for use as discussed above. Preferably, any location on the post that will properly receive both of the pins 38 will necessarily cause the support surface 40 of the engagement block 36 to be automatically aligned with a juncture or boundary line extending between two adjacent Rack Units defined on the post by the irregular mounting hole spacing.

For instance, FIGS. 4 and 5 show the state of a mounting operation in which the technician has applied a first portable tool 30 to the left post 48 of a server rack 46 and a second portable tool 30 to the right post 50 of the rack 46. As shown in FIGS. 6 and 8, the pins 38 of the engagement block 36 extend through apertures, 52 and 54, in the posts. The first and second tools 30 are secured at the same elevation on each of the posts, 48 and 50. This locates the support surfaces 40 of each engagement block 36 at a location that will result in proper mounting aperture alignment when electronic equipment or panel is freely rested on the support surfaces 40 of the engagement blocks 36.

For example, electronic equipment or panel 56 having a faceplate 58 with opposite mounting flanges, 60 and 62, may be supported directly on the support surfaces 40 of the engagement blocks 36. Here, the mounting flanges, 60 and 62, freely rest on the support surfaces 40 of the engagement blocks 36. Each of the mounting flanges, 60 and 62, have a pair of mounting apertures, 64 and 66, that necessarily become automatically aligned with a pair of mounting apertures, 114 and 116, in the posts, 48 and 50, when supported on the engagement blocks 36.

Thus, having applied the two tools 30 to the posts, 48 and 50, and having freely rested the mounting flanges, 60 and 62, of the electronic equipment or panel 56 on the support surfaces 40 of the engagement blocks 36 solely under the force of gravity, the technician has both hands free to secure fastening hardware 68 through each of the mounting apertures, 64 and 66, in the mounting flanges, 60 and 62, and into corresponding mounting apertures, 52 and 54, in the posts 48 and 50, which are already in proper alignment. See FIG. 6. This completes installation of the electronic equipment 56 on the rack 46. Thus, each of the tools 30, which extend entirely underneath the electronic equipment 56 on the rack 46, may be readily removed (i.e., un-clamped) from the rack 46 for re-use in mounting another piece of electronic equipment to a rack.

Figure 7:
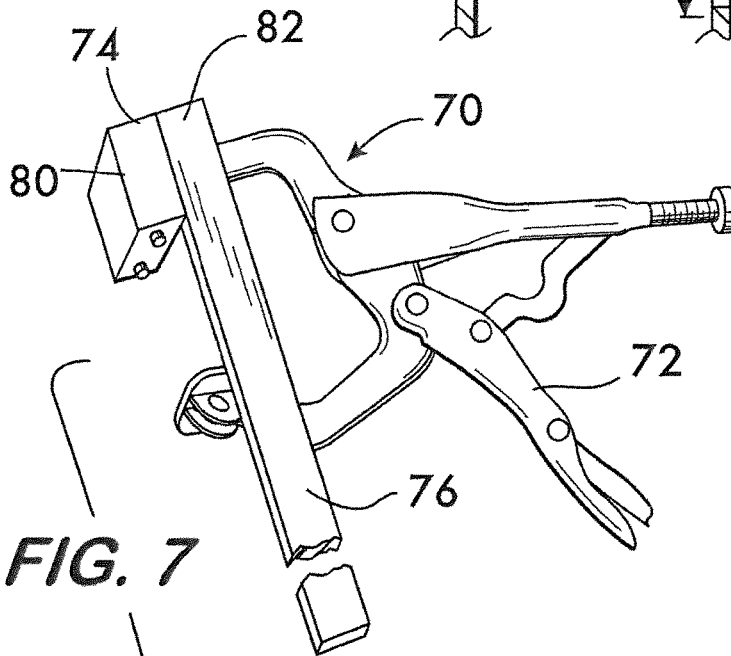
FIG. 7 is a perspective view of a tool having an engagement block in accordance with a fourth embodiment.

FIG. 7 discloses another example of a hand-held portable tool 70 that may be used for temporarily supporting larger or heavier electronic equipment in which the center of gravity may be located well behind the faceplate. In this embodiment, the tool 70 includes a toggle clamp 72 having an engagement block 74 (similar to engagement block 10 or 20 discussed above) forming one of the jaws thereof. In addition, the tool 70 also includes an elongated support bracket 76, such as an L-bracket or the like, secured to and extending from a side 78 of the engagement block 74. The bracket 76 provides an upper support surface 80 that is level and co-planar with the support surface 82 provided by the engagement block 74.

Accordingly, as best shown in FIGS. 9 and 10, separate ones of the tool 70 may be secured (i.e. clamped) to each post, 86 and 88, of a rack 84 at the same elevation within the rack 84. In this condition, the pins 90 of the engagement blocks 74 extend through corresponding apertures, 92 and 94, in the posts, 86 and 88, and the support surfaces 80 and 82 are properly positioned to be available for support electronic equipment freely rested thereon.

The electronic equipment 96 has a faceplate 98 with an opposed pair of mounting flanges, 100 and 102, and a body 104 which extends rearward from the faceplate 98. The mounting flanges, 100 and 102, are freely rested and positioned on the support surfaces 82 of the engagement blocks 74 and the body 104 of the electronic equipment 96 is freely rested and supported on the support surfaces 80 of the elongated brackets 76. In this condition, the mounting apertures, 106 and 108 in the mounting flanges, 100 and 102, are properly aligned with mounting apertures, 110 and 112, provided in the posts, 86 and 88.

In the above condition, both hands of the technician are free to apply fasteners to secure the mounting flange, 100 and 102, of the electronic equipment 96 directly to the posts, 86 and 88. Thereafter, the tools 70 may be unclamped or removed from the posts, 86 and 88, and reused in the next mounting procedure.

Accordingly, a method of mounting electronic equipment or panels on an equipment rack may comprise the steps of attaching a first portable tool (as described above) to a first upright post of an equipment rack, and after this step is complete, freely resting or positioning a mounting flange of a faceplate of electronic equipment on the support surface of the engagement block of the first tool. The support surface is necessarily positioned to cause alignment of a mounting aperture of the mounting flange with a mounting aperture of the first post. Thereafter, the method includes steps of securing fastening hardware through the aligned mounting apertures of the mounting flange and the first post to secure the electronic equipment or panel directly to the first post and then removing the first portable tool from the first post.

The above method may also include the use of a second portable tool attached to a second post for supporting an opposite mounting flange of the electronic equipment or panel as previously described. Still further, four tools may be utilized on a four-post rack, one tool per post.

The foregoing description and specific embodiments are merely illustrative of the principles thereof, and various modifications and additions may be made to the apparatus by those skilled in the art, without departing from the spirit and scope of this invention.

I claim:

1. An assembly, comprising:
   an equipment rack having first and second spaced-apart upright posts, each of said first and second posts having an irregular series of vertically-spaced mounting apertures defining a plurality of rack units along a height of the post;
   electronic equipment or panel having a faceplate with opposite laterally-extending mounting flanges, each of said mounting flanges having at least one mounting aperture extending therethrough; and
   a first portable tool comprising a rack engagement block having at least one pin and an upper surface spaced from said at least one pin and defining a support surface;
   said first portable tool being engaged to said first post such that said at least one pin is received within one of said mounting apertures of said first post, said support surface is spaced above said at least one pin to extend along a juncture between adjacent rack units defined on the post, and one of said mounting flanges of said faceplate is freely rested or positioned on said support surface of said first portable tool such that said at least one mounting aperture of said mounting flange is in alignment with one of said mounting apertures of said first post thereby enabling ready securement of said mounting flange directly to said first post with fastening hardware.

2. An assembly according to claim 1, further comprising a second tool having at least one pin and an upper surface defining a support surface, wherein said second tool is engaged to said second post such that said at least one pin is received within one of said mounting apertures of said second post and an opposite one of said mounting flanges of said faceplate is freely rested or positioned on said support surface of said second tool such that said at least one mounting aperture of said opposite one of said mounting flanges is aligned with one of said mounting apertures of said second post thereby enabling ready securement of said mounting flanges directly to said first and second posts with fastening hardware at a common elevation within said rack.

3. An assembly according to claim 2, wherein said first and second tools are interconnected.

4. An assembly according to claim 2, wherein said first and second tools are separate.

5. An assembly according to claim 1, wherein said engagement block has at least a pair of spaced apart pins extending therefrom for simultaneous insertion into different spaced-apart mounting apertures on said first post.

6. An assembly according to claim 1, wherein said first portable tool includes an elongated support bracket providing an elongated support surface coplanar with said support surface of said engagement block, and wherein said elongated support bracket extends along an inside side edge of said first post within said equipment rack with a body of said electronic equipment or panel freely resting thereon.

7. An assembly according to claim 1, wherein said engagement block is at least partly made of a magnetic material such that said engagement block is able to be magnetically secured to the first post of the equipment rack.

8. An assembly according to claim 1, wherein said at least one pin is of a length sufficient to extend completely through said mounting aperture of said first post and receive at least one removable securement clip on a free end thereof to temporarily secure said engagement block to said first post.

9. An assembly according to claim 1, wherein said first portable tool further comprises a clamp having a pair of opposed jaws, wherein said engagement block forms one of said opposed jaws of said clamp and wherein said at least one pin extends in a direction toward said other jaw of said clamp.

10. A method of mounting electronic equipment or a panel on an equipment rack, comprising the steps of:
    attaching a first portable tool to a first upright post of an equipment rack, the first portable tool comprising a rack engagement block having at least one pin and an upper surface spaced from the at least one pin defining a support surface;
    after said attaching step, resting or positioning a mounting flange of a faceplate of electronic equipment or panel on the support surface which is positioned to cause alignment of a mounting aperture of the mounting flange with a mounting aperture of the first post;
    securing fastening hardware through the aligned mounting apertures of the mounting flange and the first post to secure the electronic equipment or panel directly to the first post; and
    after said securing step, removing the first portable tool from the first post.

11. A method according to claim 10, wherein the first post has an irregular series of vertically spaced-apart mounting apertures that define a plurality of rack units along a height thereof and the first portable tool has a pair of pins that are simultaneously inserted through separate spaced-apart mounting apertures of the first post during said attaching step, and wherein the support surface of the engagement block is spaced above the pins such that the support surface is located at a juncture extending between adjacent rack units defined along the height of the first post during said resting or positioning step.

12. A method according to claim 10, wherein the equipment rack includes a second upright post spaced from the first post, wherein a second portable tool is attached to the second post during said attaching step, wherein the faceplate includes opposite laterally-extending mounting flanges with one of the mounting flanges positioned on the support surface of the first portable tool and the other of the mounting flanges rested on the support surface of the second portable tool during said resting or positioning step, wherein fastening hardware is used to secure the mounting flanges to the first and second posts during said securing step, and wherein the first and second portable tools are removed from the rack during said removing step.

13. A method according to claim 10, wherein said attaching step is selected from the group consisting of magnetically attaching the engagement block to the first post, clamping the engagement block to the first post, and attaching a securement clip to a free end of the at least one pin of the engagement block.

* * * * *